United States Patent [19]

Brunner

[11] Patent Number: 4,729,492

[45] Date of Patent: Mar. 8, 1988

[54] RAM CARTRIDGE

[75] Inventor: Charles S. Brunner, Somerville, N.J.

[73] Assignee: Unisys Corporation, Blue Bell, Pa.

[21] Appl. No.: 23,949

[22] Filed: Mar. 5, 1987

Related U.S. Application Data

[63] Continuation of Ser. No. 730,090, May 3, 1985, abandoned.

[51] Int. Cl.[4] .............................................. B65D 85/00
[52] U.S. Cl. ......................................... 220/335; 220/6
[58] Field of Search ........................ 220/6, 335, 4 F, 7

[56] References Cited

U.S. PATENT DOCUMENTS

| | | | |
|---|---|---|---|
| 2,520,508 | 8/1950 | Morrison | 220/335 |
| 3,250,427 | 5/1966 | Pogue | 220/335 |
| 3,782,579 | 1/1974 | Zarges | 220/6 |
| 3,941,271 | 3/1976 | Zarges et al. | 220/6 |
| 4,036,396 | 7/1977 | Kennedy et al. | 220/335 |
| 4,124,438 | 6/1985 | Einhaus | 220/335 |
| 4,148,411 | 4/1979 | Hodge et al. | 220/335 |
| 4,239,093 | 12/1980 | Eubanks et al. | 220/335 |
| 4,460,105 | 7/1984 | Cox | 220/335 |

Primary Examiner—Joseph Man-Fu Moy
Attorney, Agent, or Firm—Mark T. Starr

[57] ABSTRACT

A RAM cartridge having a pivotable tab which is adapted to be pivoted and grasped to permit removal of the cartridge from a slot in a housing. The tab is seated, inside the cartridge, on a post by means of a specially shaped aperture which permits the tab to slide away from an adjacent wall of the housing, which would prevent its pivoting, to a position at which it can be pivoted and grasped.

7 Claims, 9 Drawing Figures

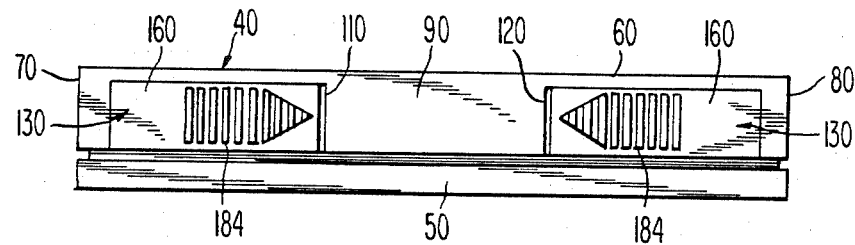
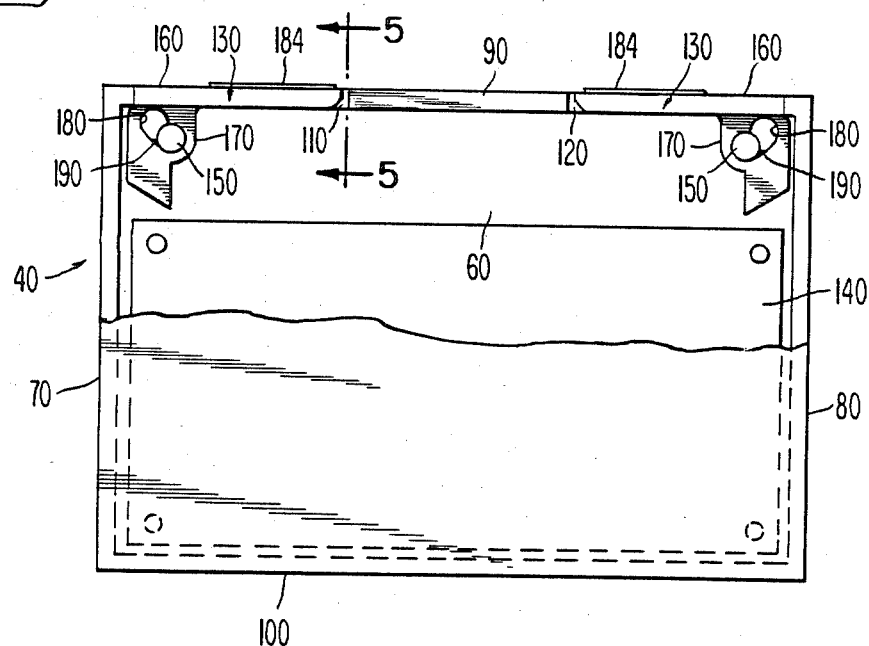
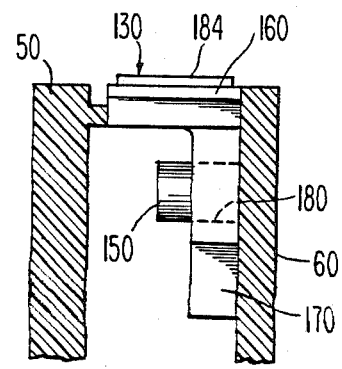

RAM CARTRIDGE

This is a continuation of co-pending application Ser. No. 730,090, filed on May 3, 1985, now abandoned.

BACKGROUND OF THE INVENTION

In the central processor units of some types of computers, a RAM cartridge is used which comprises a plastic case containing one or more circuit boards. In operation of a computer system, it becomes necessary to remove the RAM cartridge from its container from time to time to insert another cartridge or for some other reasons, and, in some hardware, it is difficult to remove these cartridges because of space considerations.

The present invention solves this problem by providing a RAM cartridge with tabs which can be easily manipulated to remove the cartridge from its housing.

DESCRIPTION OF THE DRAWINGS

FIG. 3 is a plan view of the inside surface of the cartridge of the invention with the cover removed;

FIG. 4 is a plan view of the apparatus of FIG. 3;

FIG. 5 is a view of a locking tab of the invention taken along the line 5—5 in FIG. 3.

DESCRIPTION OF THE INVENTION

Figure 1:
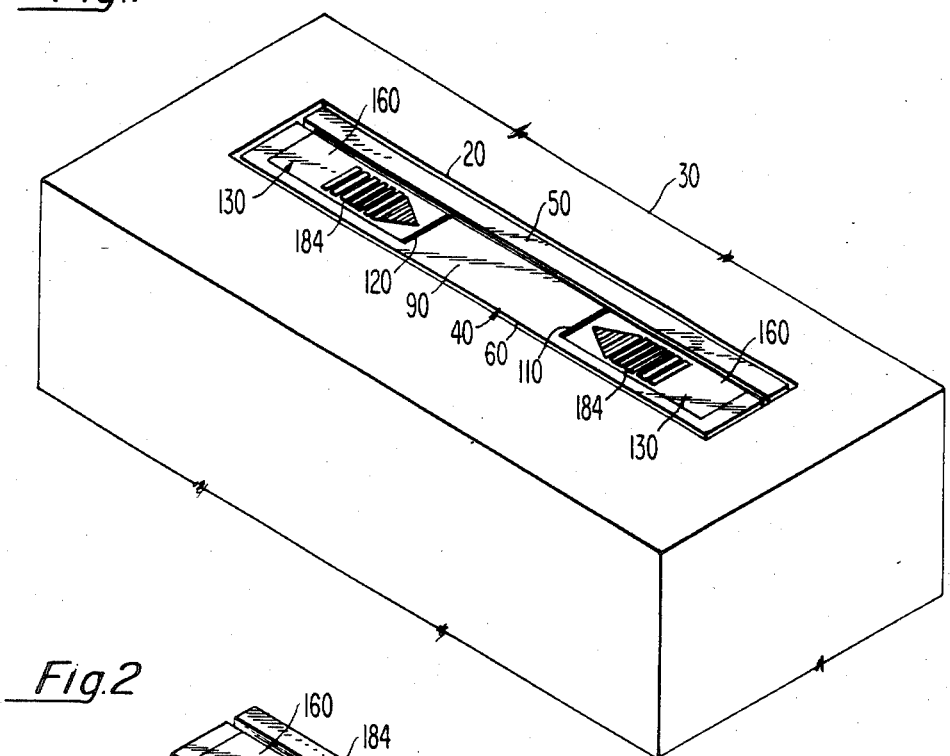
FIG. 1 is a perspective view of a portion of a housing containing a cartridge embodying the invention.
Figure 2:
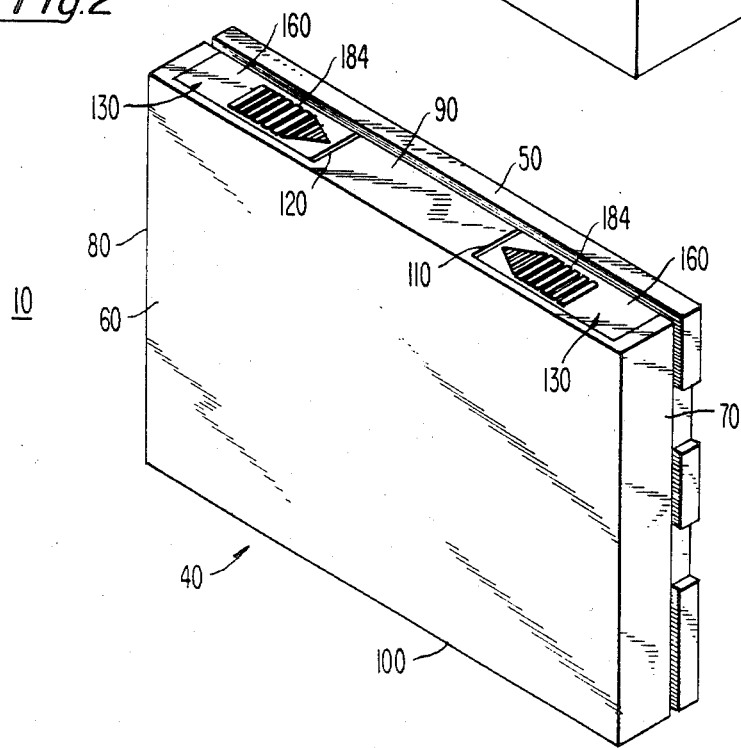
FIG. 2 is a perspective view of the cartridge of the invention.
Figure 6:
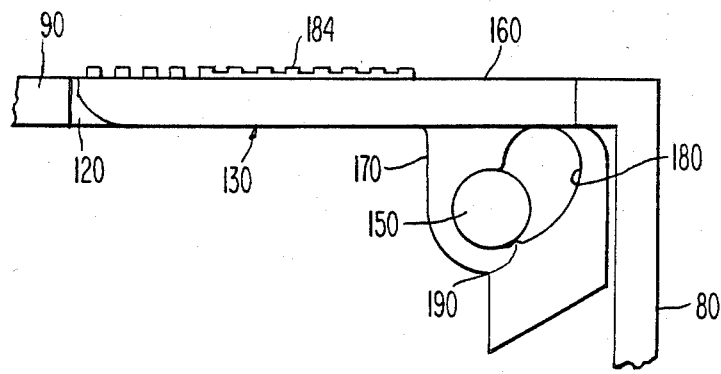
FIGS. 6 through 9 illustrate the operation of the invention through its various stages of motion.

A cartridge 10 embodying the invention is adapted to be inserted in a slot 20 in a housing represented by the numeral 30 and comprising, for example, a portion of a central processor unit of a computer. Of course, a cartridge embodying the invention may be used in other applications as those skilled in the art will appreciate. The cartridge 10 comprises a base 40 which is sufficiently deep to receive a circuit card and a cover 50 which couples to the base. The base 40 is defined by, and its depth is provided by, a bottom wall 60, two side walls 70 and 80, an upper wall 90, and a lower wall 100, all of which rise from the bottom wall 60 to provide the depth for housing a printed circuit board 140. The upper wall 90 of the base 40 is provided with two openings 110 and 120, in which tabs 130 are seated which are used to remove the cartridge 10 from the slot 20 in the housing 30.

Referring to FIG. 3, the inside of the base 40 has two spaced-apart posts 150, on which the tabs 130 pivot. The posts 150 are provided adjacent to the upper wall 90 and adjacent to the two side walls 70 and 80. Posts 150 may also support printed circuit board 140. As shown in FIGS. 3 and 4, the openings 110 and 120 in the upper wall 90 extend from the side walls 70 and 80 toward each other a suitable distance, and the tabs 130 fill these openings. Without the invention, described below, if the tabs 130 were pivoted, they would strike the side walls 70 and 80, and they could not pivot enough to be able to be used to remove the cartridge 10 from the slot 20.

The tabs 130 themselves are generally L-shaped and include a flat portion 160 which is positioned in the openings 110, 120 in the wall 90, coplanar with wall 90, and a depending wall portion 170 (FIG. 5) whoich depends from the edge of the flat portion 160 adjacent to base wall 60 of the receiver. According to the invention, the depending wall portion 170 is provided with an opening 180 which is made up of an infinite number of circles scribed on a section of a parabola. In less technical terms, the opening 180 looks like two adjacent circles overlapped and combined to form a shape which looks like a stretched heart, the one on the left oriented from upper left to lower right, and the one on the right oriented from upper right to lower left. There is also a bump 190 at the lowest point of the openings 180.

The tabs 130 are provided with roughened portions or striations 184 on their outer surfaces.

Figure 7:
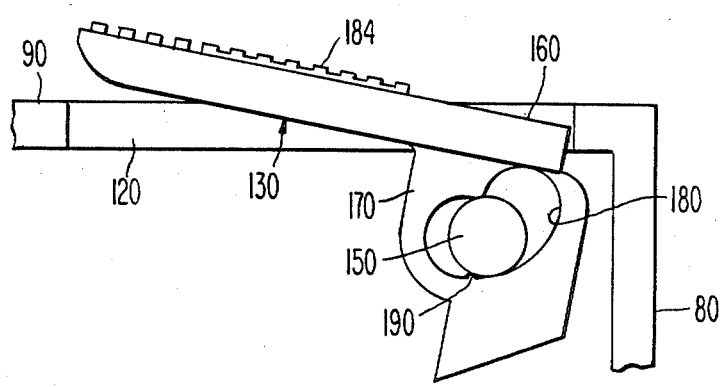
Figure 8:
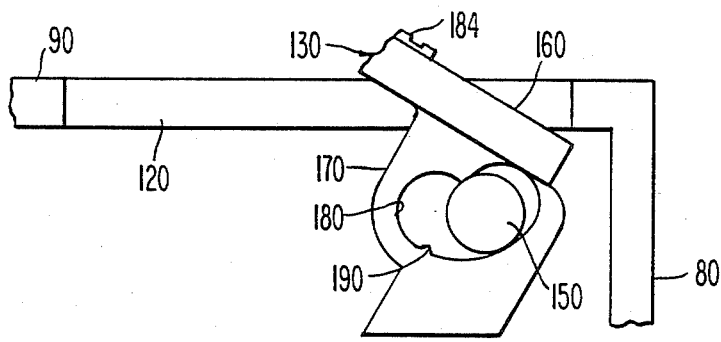
Figure 9:
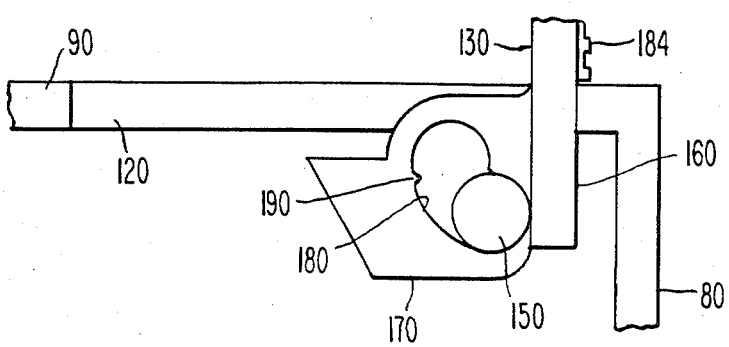

In operation of the invention, referring to FIGS. 6–9, assume that the cartridge 10 is inserted in the slot 20 in the housing 30, with the tabs 130 lying flat in the upper wall of the cartridge receiver portion. In this orientation, the lower portions of the openings 180 in the tabs 130 have the posts 150 at their centers, and the posts are held in place by the bumps 190 (FIG. 8). To remove the cartridge 10, the tabs 130 are rotated and pushed forwardly by the fingers of the user bearing on the striations 184, and this force causes the rear portions of the tabs to drop downwardly and the openings 180 to move downwardly. During this operation and movement of the parts, the posts 150 appear to move from the portion of the openings 180 in which they are locked toward the other portions of the openings 180, as shown in FIGS. 7 and 8, and, as the tabs are pivoted, finally, the posts are positioned in the other circular portions of the openings 180 (FIG. 9). This movement spaces the tabs 130 a suitable distance from the side walls 70 and 80 of the base of the cartridge, as seen in FIGS. 8 and 9, so that the tabs can be pivoted and grasped by the user, and the cartridge can be pulled out of the slot in the housing.

What is claimed is:

1. An assembly comprising:
   a tab adapted to be grasped to manipulate a device to which said tab is attached: and
   means including an immovable post, said tab being pivotally seated on said post:
   said tab having an aperture by means of which it is seated on said post, said aperture being generally heart-shaped, said aperture having on one side thereof a smooth arcuate wall and on the opposite side an indented wall, an inward projection formed into the aperture on said smooth arcuate wall;
   said tab assuming a closed non-graspable position wherein said post is located at one extremity of said aperture, said tab being retained in said closed position by the contact of said projection with said post, said tab being rotated in response to an external force applied thereto and thereby assuming an open graspable position, the concurrent rotation of said aperture causing said post to be relocated to the opposite extremity of said aperture.

2. The assembly in accordance with claim 1 wherein said smooth arcuate wall is parabolic.

3. An apparatus comprising:
   a cartridge: and a housing having a slot therein, said housing being adapted to receive said cartridge via said slot;
   said cartridge including means for removing said cartridge from said housing, said means including a tab passing through an opening in an end of said cartridge, said tab having an aperture therethrough, a post connected to an inner sidewall of said cartridge, said tab being pivotally coupled to said post via said aperture, said aperture being generally heart-shaped, said aperture having on one side thereof a smooth arcuate wall and on the opposite side an indented wall, an inward projection formed into the aperture on said smooth arcuate wall;

said tab assuming a closed position wherein said tab is substantially coplanar with said end of said cartridge, said post being located at one extremity of said aperture when said tab is in said closed position, said tab being retained in said last mentioned position by the contact of said inward projection with said post, said tab being rotated in response to an external force applied thereto, the concurrent rotation of said aperture causing said post to be relocated to the opposite extremity of said aperture, whereupon said tab assumes an open position and lies in a plane substantially transverse to the plane of said end of said cartridge.

4. The apparatus in accordance with claim 3 wherein said smooth arcuate wall is parabolic.

5. An apparatus comprising:

a cartridge having a generally rectangular box-like configuration; and a housing having a slot therein, said housing being adapted to receive said cartridge via said slot;

said cartridge including means for removing said cartridge from said housing, said means including at least a first tab passing thorugh an opening in an upper wall of said cartridge, said tab having a substantially planar section and an integral depending member oriented transverse to said planar section and having an aperture therein, a post immovably affixed to an inner sidewall of said cartridge, said tab being pivotally coupled to said post via said aperture, said aperture being generally heart-shaped, said aperture having on one side thereof a smooth arcuate wall and on the opposite side thereof a wall having a centrally disposed indentation therein, said indentation separating a pair of generally circular intersecting portions of said aperture, an inward projection formed into said smooth arcuate wall of a first of said circular portions of said aperture;

said tab assuming a closed position wherein said planar section of said tab is substantially coplanar with the outer surface of said upper wall of said cartridge, said post being located within said first of said circular portions of said aperture when said tab is in said closed position, said tab being retained in said last mentioned position by the contact of said inward projection with said post, said tab being rotated in response to an external force applied thereto through a circular arc in a plane parallel to that of said sidewall of said cartridge, the concurrent rotation of said integral depending member of said tab causing said post to be relocated in the second of said circular portions of said aperture, whereupon said planar section of said tab assumes an open position and lies in a plane substantilly transverse to the lane of said upper wall of said cartridge, thereby permitting the grasping of said tab and the removal of said cartridge from said housing.

6. An apparatus as defined in claim 5 further including a second tab passing through a second opening in said upper wall of said cartridge, said first and second tabs being situated in mirror-image relationship at respective opposite extremities of said upper wall.

7. An apparatus as defined in claim 6 wherein said housing is a portion of the central processing unit of a computer and said cartridge is a RAM module.

* * * * *